United States Patent
Xiao

(10) Patent No.: US 10,707,418 B2
(45) Date of Patent: Jul. 7, 2020

(54) ORGANIC LIGHT-EMITTING DIODE DEVICE, MANUFACTURING METHOD THEREOF AND EVAPORATION EQUIPMENT

(71) Applicants: Boe Technology Group Co., Ltd., Beijing (CN); Ordos Yuansheng Optoelectronics Co., Ltd., Ordos (CN)

(72) Inventor: Ang Xiao, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 172 days.

(21) Appl. No.: 15/627,559

(22) Filed: Jun. 20, 2017

(65) Prior Publication Data

US 2017/0324036 A1  Nov. 9, 2017

Related U.S. Application Data

(62) Division of application No. 14/744,168, filed on Jun. 19, 2015, now Pat. No. 9,716,228.

(30) Foreign Application Priority Data

Feb. 3, 2015 (CN) .......................... 2015 1 0057291

(51) Int. Cl.
*H01L 51/00* (2006.01)
*H01L 51/50* (2006.01)
(Continued)

(52) U.S. Cl.
CPC ............ *H01L 51/001* (2013.01); *C23C 14/24* (2013.01); *H01L 51/5004* (2013.01);
(Continued)

(58) Field of Classification Search
CPC .............................. C23C 14/24; C23C 16/042
See application file for complete search history.

(56) References Cited

U.S. PATENT DOCUMENTS 4,401,052 A * 8/1983 Baron ..................... C23C 14/24
118/715
5,834,894 A 11/1998 Shirasaki
(Continued)

FOREIGN PATENT DOCUMENTS

| CN | 2574214 Y | * | 9/2003 |
| CN | 2574214 Y |   | 9/2003 |

(Continued)

OTHER PUBLICATIONS

CN2574214Y, Machine Translation (Year: 2003).*
(Continued)

*Primary Examiner* — Robert A Vetere
(74) *Attorney, Agent, or Firm* — Calfee, Halter & Griswold LLP

(57) ABSTRACT

The present disclosure provides an organic light-emitting diode (OLED) device, comprising at least two electron transport layers between a cathode and a light-emitting layer of the device, wherein energy barrier of different electron transport layers successively increase from the cathode to the light-emitting layer. The present disclosure also provides an evaporation equipment and an OLED device manufacturing method, wherein the electron transport layers of the OLED device are formed by an evaporation process using the evaporation equipment. The OLED device of the present disclosure improves the luminescence efficiency of OLED devices, and the evaporation equipment can readily effect a fast switching between different evaporation rates within a same evaporation chamber.

13 Claims, 2 Drawing Sheets

(51) Int. Cl.
*H01L 51/56* (2006.01)
*C23C 14/24* (2006.01)

(52) U.S. Cl.
CPC ........ *H01L 51/508* (2013.01); *H01L 51/5076* (2013.01); *H01L 51/56* (2013.01); *H01L 2251/55* (2013.01)

(56) References Cited

U.S. PATENT DOCUMENTS

| | | | |
|---|---|---|---|
| 9,716,228 B2 | 7/2017 | Xiao | |
| 2003/0038287 A1 | 2/2003 | Suzuki | |
| 2005/0179370 A1 | 8/2005 | Nakayama | |
| 2007/0207345 A1 | 9/2007 | Royster | |
| 2009/0075215 A1* | 3/2009 | Vaccaro | C23F 1/02 430/321 |
| 2011/0041758 A1* | 2/2011 | An | C23C 14/042 118/504 |
| 2011/0147716 A1 | 6/2011 | Kondakova | |
| 2014/0315342 A1* | 10/2014 | Edura | H01L 51/001 438/46 |
| 2014/0315343 A1* | 10/2014 | Kim | C23C 14/042 438/46 |

FOREIGN PATENT DOCUMENTS

| | | |
|---|---|---|
| CN | 1753592 A | 3/2006 |
| CN | 101182627 A | 5/2008 |
| CN | 103993269 A | 8/2014 |
| KR | 20140098693 | 8/2014 |

OTHER PUBLICATIONS

Office Action from Chinese Application No. 201510057291.2 dated Nov. 22, 2016.
Office Action from Chinese Application No. 201510057291.2 dated Jun. 1, 2016.
Office Action for U.S. Appl. No. 14/744,168 dated Jul. 20, 2016.
Response to Office Action dated Jul. 20, 2016 for U.S. Appl. No. 14/744,168 dated Oct. 20, 2016.
Office Action for U.S. Appl. No. 14/744,168 dated Nov. 10, 2016.
Response to Office Action dated Nov. 10, 2016 for U.S. Appl. No. 14/744,168 dated Feb. 10, 2017.
Notice of Allowance for U.S. Appl. No. 14/744,168 dated Jun. 22, 2017.
Second Office Action for Chinese Patent Application No. 201510057291.2 dated Aug. 1, 2017.

* cited by examiner

US 10,707,418 B2

ORGANIC LIGHT-EMITTING DIODE DEVICE, MANUFACTURING METHOD THEREOF AND EVAPORATION EQUIPMENT

RELATED APPLICATIONS

The present application is a divisional application of U.S. Ser. No. 14/744,168, filed Jun. 19, 2015, titled ORGANIC LIGHT-EMITTING DIODE DEVICE, MANUFACTURING METHOD THEREOF AND EVAPORATION EQUIPMENT, which claims the benefit of Chinese Patent Application No. 201510057291.2, filed on Feb. 3, 2015, the entire disclosure of which is incorporated herein by reference.

FIELD

The present disclosure relates to the technical field of organic light-emitting diodes and evaporation technology, and in particular to an organic light-emitting diode device and a manufacturing method thereof, and an evaporation equipment.

BACKGROUND

An Organic Light-Emitting Diode (OLED) is a display device capable of autonomous luminescence from a luminescent material driven by electric current. The luminescent material conventionally used in an OLED device is small molecules in form of dyes or pigments. These small molecules are deposited on a substrate in a particular pattern by means of a vacuum evaporation process.

As shown in FIG. 1, a current mainstream OLED device structure consists of an anode, a hole injection layer, a hole transport layer, a light-emitting layer, an electron transport layer and a cathode. Therein, except for the cathode or the anode to be made of a metal material, the others are all made from organic small molecules.

Most of the prior art methods for improving a luminescence efficiency of the OLED devices are to replace the materials of the organic layers or to add different deposition layers. However, in a prior art vacuum evaporation process, the evaporation process for each layer needs to be completed in a separate chamber. At present, a length of around 10 hours in time will be needed, as a rate stabilizing period, for a material to attain a stable evaporation rate, and accordingly, the prior art methods of changing the OLED device structure for improving the luminescence efficiency would lead to cost increase and extended period of the evaporation process.

SUMMARY

Considering the above drawbacks in the prior art, the present disclosure provides an organic light-emitting diode device, of which the luminescence efficiency is improved by arranging electron transport layers with different guest doping concentrations to reduce the energy barrier to be overcome as required for transporting electrons to the light-emitting layer. Meanwhile, a method for manufacturing the organic light-emitting diode device and an evaporation equipment are provided.

In a first aspect, the present disclosure provides an organic light-emitting diode device, comprising at least two electron transport layers between a cathode and a light-emitting layer of the device, wherein energy barrier of different electron transport layers successively increase from the cathode to the light-emitting layer.

According to some embodiments, a mass ratio between a host material and a guest material in different electron transport layers successively increases from the cathode to the light-emitting layer.

According to some embodiments, the at least two electron transport layers may comprise three layers, among which the mass ratio between the host material and the guest material in an electron transport layer close to the cathode is between 1:10 and 1:100, the mass ratio between the host material and the guest material in an intermediate electron transport layer is between 1:3 and 1:1, and the mass ratio between the host material and the guest material in an electron transport layer close to the light-emitting layer is between 1:1 and 1:0.5. In particular, the mass ratio between the host material and the guest material in the electron transport layer close to the cathode is between 1:10 and 0.

In a second aspect, the present disclosure provides an evaporation equipment, comprising an evaporation material filling cavity, an evaporation material nozzle and a rate control screen. The rate control screen is arranged between the evaporation material filling cavity and the evaporation nozzle in communication, for controlling the amount of an evaporation material therethrough, in unit time, from the evaporation material filling cavity to the evaporation material nozzle, so as to control an evaporation rate for the evaporation material, and comprises at least two types of connected rate control sub-screens with different evaporation rates; the rate control screen can move relatively to the evaporation material nozzle for switching the type of the rate control sub-screens in alignment with the evaporation material nozzle. In particular, the evaporation material may be the host material or the guest material of the electron transport layers in the above organic light-emitting diode device.

According to some embodiments, there may be more than one said evaporation material nozzles, different types of rate control sub-screens are spaced and alternately arranged, and between rate control sub-screens of the same type, a distance between rate control sub-screens is equal to a distance between adjacent evaporation material nozzles.

According to some embodiments, the different types of rate control sub-screens may have different opening densities. In particular, if the at least two types of rate control sub-screens with different evaporation rates comprise three types of rate control sub-screens, the opening densities of these three types may be 250-400 mesh, 150-200 mesh and 10-100 mesh, respectively.

According to some embodiments, the different types of rate control sub-screens may be spaced and arranged in an order according to the magnitude of the opening density.

According to some embodiments, a spacing zone may be arranged between the rate control sub-screens, which spacing zone may be made of invar and have a bar or a strip shape with no openings.

According to some embodiments, the evaporation equipment may further comprise a second evaporation material filling cavity and a second evaporation material nozzle that are not in communication with the evaporation material filling cavity and the evaporation material nozzle, for evaporation of a second evaporation material which is different from the evaporation material.

According to some embodiments, the evaporation equipment may further comprise a second rate control screen. The second rate control screen is arranged between the second evaporation material filling cavity and the second evaporation nozzle in communication, for controlling the amount of the second evaporation material therethrough, in unit time, from the second evaporation material filling cavity to the second evaporation material nozzle, so as to control an evaporation rate for the second evaporation material, and comprises at least two types of connected second rate control sub-screens with different evaporation rates; the second rate control screen can move relatively to the second evaporation material nozzle for switching the type of the second rate control sub-screens in alignment with the second evaporation material nozzle.

According to some embodiments, the evaporation equipment may further comprise a screen forwarding control wheel for rotation to move the rate control screen.

In a third aspect, the present disclosure provides a method for manufacturing an organic light-emitting diode device, said device comprising at least two electron transport layers, which are formed by an evaporation process using the evaporation equipment described above, the method may comprise providing a host material or a guest material in the evaporation material cavity as the evaporation material, according to a mass ratio between the host material and the guest material for each electron transport layer as required to be formed in the device, moving the rate control screen, such that one type of corresponding rate control sub-screens is aligned in order with the evaporation material nozzle, and evaporating the evaporation material to form each electron transport layer in order.

It can be seen from the above technical solutions that the present disclosure provides an organic light-emitting diode device, of which the luminescence efficiency is improved by adding a plurality of electron transport layers with different guest doping concentrations, between a cathode and a light-emitting layer, to reduce the energy barrier to be overcome as required for transporting electrons to the light-emitting layer. The present disclosure further provides an evaporation equipment and a method for manufacturing an organic light-emitting diode device using the evaporation equipment. With no change to other evaporation conditions, a fast switching among different evaporation rates within a same evaporation chamber can be realized by simply moving a rate control screen, which is time-saving and results in improved evaporation efficiency and a plurality of electron transport layers with different guest doping concentrations can be formed conveniently. Meanwhile, since there is no need to provide more evaporation chambers or changing other process conditions, the equipment cost in both manufacture and use is reduced, and the resulting equipment is easily operable.

BRIEF DESCRIPTION OF THE DRAWINGS

In order to illustrate the technical solution in embodiments of the present disclosure or in the prior art more clearly, the accompanying drawings required to be used in the description of the embodiments or the prior art will be introduced briefly as follows. It is evident that the drawings in the following description are only some embodiments of the present disclosure, and for an ordinarily skilled in the art, other drawings based on these ones can be obtained without making an inventive effort.

DETAILED DESCRIPTION

The technical solution in embodiments of the present disclosure will be described clearly and completely in conjunction with the drawings in the embodiments of the present disclosure. Obviously, the described embodiments are only a part, rather than an entirety, of the embodiments of the present disclosure. Based on the embodiments in the present disclosure, all the other embodiments obtainable by the ordinarily skilled in the art without making an inventive effort fall into the scope of the present disclosure.

Figure 1:
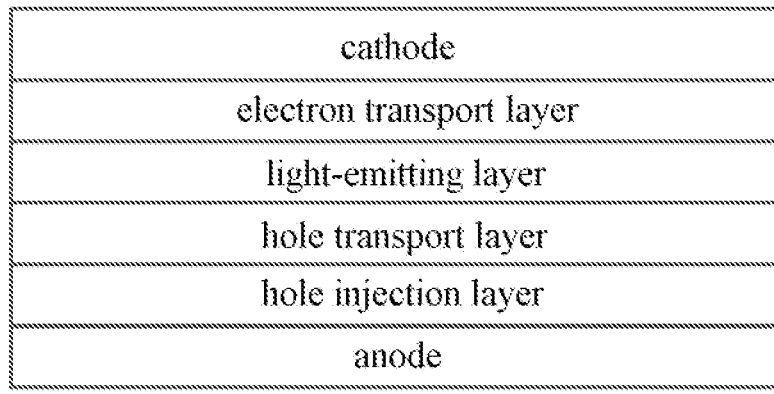
FIG. 1 is a schematic diagram of the structure of a prior art OLED device.
Figure 2:
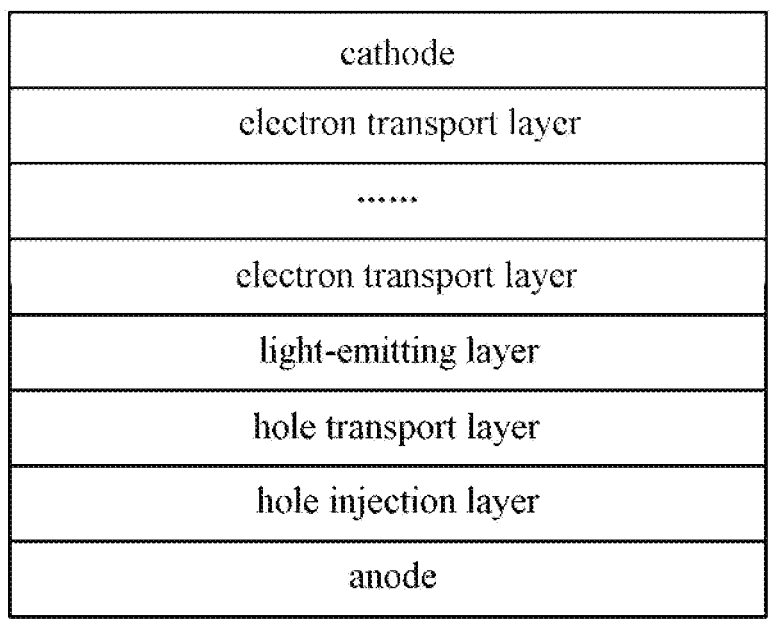
FIG. 2 is a schematic diagram of a general structure of an OLED device provided by a first embodiment of the present disclosure.

FIG. 2 shows an organic light-emitting diode device provided by a first embodiment of the present disclosure. The organic light-emitting diode device comprises a cathode, at least two electron transport layers, a light-emitting layer, a hole transport layer, a hole injection layer and an anode. Energy barriers of different electron transport layers successively increase from the cathode to the light-emitting layer. It enables that electrons transported from the cathode pass through a plurality of smaller energy barriers and arrive at the light-emitting layer, thereby improving the luminescence efficiency of the organic light-emitting diode device.

In this embodiment, it can be arranged such that a mass ratio between a host material and a guest material in different electron transport layers successively increases from the cathode to the light-emitting layer, thereby making the energy barrier increment through the electron transport layers.

Figure 3:
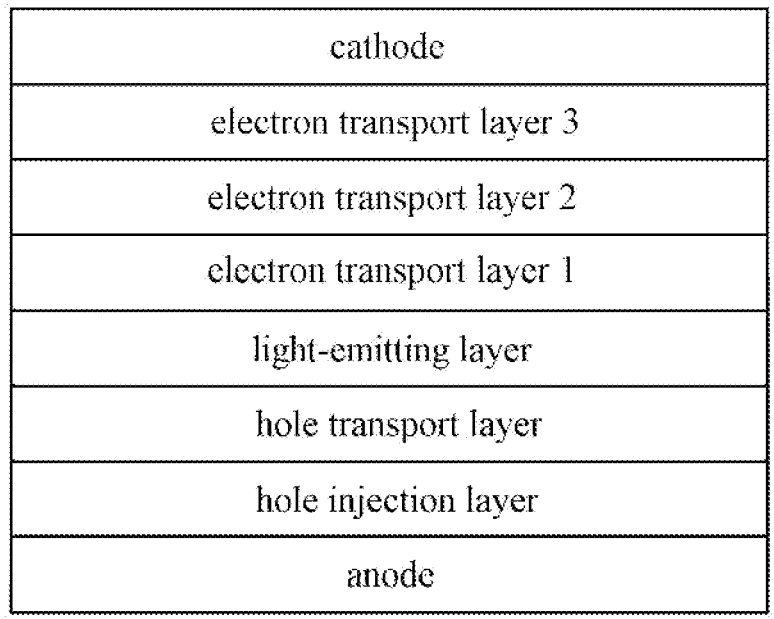
FIG. 3 is a schematic diagram of another structure of the OLED device provided by the first embodiment of the present disclosure.

Further, the at least two electron transport layers comprise three layers, that is, as shown in FIG. 3, the organic light-emitting diode device comprises in order a cathode, an electron transport layer 3, an electron transport layer 2, an electron transport layer 1, a light-emitting layer, a hole transport layer, a hole injection layer and an anode. Specifically, the mass ratio between the host material and the guest material in the electron transport layer 3 close to the cathode is between 1:10 and 1:100 and can even be zero, the mass ratio between the host material and the guest material in the intermediate electron transport 2 is between 1:3 and 1:1, and the mass ratio between the host material and the guest material in the electron transport layer 1 close to the light-emitting layer is between 1:1 and 1:0.5. It can be seen that the mass ratio in the electron transport layer 3, the electron transport layer 2 and the electron transport layer 1 successively increases from the cathode to the light-emitting layer, and so does the energy barrier thereof.

It needs to be noted that when the mass ratio between the host material and the guest material in the electron transport layer 3 is zero, it means that the electron transport layer 3 comprises the guest material only.

This embodiment provides an organic light-emitting diode device, of which the luminescence efficiency is improved by arranging a plurality of electron transport layers with different guest doping concentrations between the cathode and the light-emitting layer to reduce the energy barrier to be overcome as required for transporting electrons to the light-emitting layer. The skilled person in the art should understand that the organic light-emitting diode device in the present disclosure can be a functional apparatus or a part of a functional apparatus such as a display apparatus, a luminescence apparatus, etc., and in order to implement the function, adding of other structures or devices may also be required.

Figure 4:
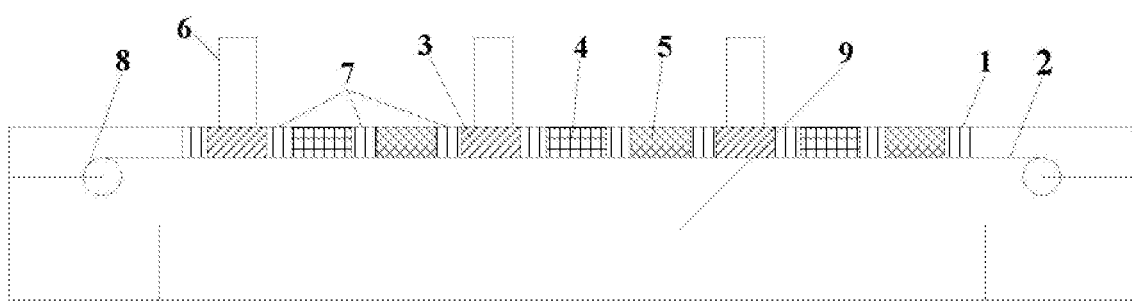
FIG. 4 is a schematic diagram of the structure of an evaporation equipment provided by a second embodiment of the present disclosure.

As shown in FIG. 4, a second embodiment of the present disclosure provides an evaporation equipment, which comprises a rate control screen 1.

As shown in FIG. 4, the rate control screen 1 is arranged between an evaporation material filling cavity 9 and an evaporation material nozzle 6 in communication, for controlling the amount of an evaporation material therethrough, in unit time, from the evaporation material filling cavity 9 to the evaporation material nozzle 6, so as to control an evaporation rate for the evaporation material. The rate control screen 1 comprises at least two types of connected rate control sub-screens with different evaporation rates. The rate control screen 1 can move relatively to the evaporation material nozzle 6 (that is, move left and right relatively to the evaporation material nozzle 6 in FIG. 4), for switching the type of the rate control sub-screens in alignment with the evaporation material nozzle 6. Therein, the nozzle 6 is closely adhered to the rate control screen 1 at an opening to the inside. By means of the evaporation equipment, depositions of the materials in the electron transport layers with various guest doping ratios can be carried out. It should be understood that the evaporation material herein can be any material suitable for evaporation, and specifically in the case of manufacturing an electron transport layer of the organic light-emitting diode device, it can be a host or a guest material.

In this embodiment, the rate control screen 1 comprises, for example, three types of rate control sub-screens 3, 4, 5 with three different evaporation rates, thus depositions of three types of electron transport layer materials with different guest doping ratios can be carried out.

In this embodiment, there are more than one evaporation material nozzles 6. Different types of rate control sub-screens are in spaced arrangement, and between rate control sub-screens of the same type, a distance between rate control sub-screens is equal to a distance between adjacent evaporation material nozzles. This enables that the rate control sub-screens of the same type to be aligned with a plurality of nozzles at the same time, and realizes evaporation for corresponding electron transport layers.

It needs to be noted that generally, the evaporation equipment can also include a second evaporation material filling cavity and a second evaporation material nozzle (not shown) that are not in communication with the evaporation material filling cavity 9 and the evaporation material nozzle 6, for evaporation of the host material and the guest material at the same time. For example, while an evaporation of the host material is performed by using the evaporation material filling cavity 9 and the evaporation material nozzle 6, an evaporation of the guest material is performed as well using the second evaporation material filling cavity and the second evaporation material nozzle, and since the evaporation rate for the host material is variable while that for the guest material is not, different electron transport layers are formed with a varying mass ratio between the host material and the guest material. An skilled person in the art may also appreciate that the second evaporation material filling cavity and the second evaporation material nozzle can also have a rate control screen, and this belongs also to the scope of the present disclosure. Of course, discrete evaporation equipments for evaporation of the host material and the guest material individually can also be used to manufacture the electron transport layers, both of which can be the evaporation equipment of the present disclosure, or one can be the evaporation equipment of the present disclosure while the other one is an evaporation equipment with a non-variable rate or other prior art evaporation equipments.

In this embodiment, the material of the rate control sub-screen is invar, which has low thermal coefficient of expansion, so that the rate control sub-screen would not be easily deformed due to high temperature when the evaporation material is evaporated.

In this embodiment, since the different rates of the rate control sub-screens are fulfilled by a size of openings, the different types of rate control sub-screens are varied in opening density. Further, the different types of rate control sub-screens are spaced and arranged in an order according to the magnitude of the opening density. To take the evaporation equipment of the present disclosure for evaporation of a host material for example, in a case where the evaporation rate for evaporating a guest material remains unchanged, if an opening density of the rate control sub-screen 3 is 10 to 100 mesh, the mass ratio between the host material and the guest material in the electron transport layer evaporated via the rate control sub-screen 3 is between 1:1 and 1:0.5; if an opening density of the rate control sub-screen 4 is 150 to 200 mesh, the mass ratio between the host material and the guest material in the electron transport layer evaporated via the rate control sub-screen 4 is between 1:3 and 1:1; if an opening density of the rate control sub-screen 5 is 250 to 400 mesh, the mass ratio between the host material and the guest material in the electron transport layer evaporated via the rate control sub-screen 5 is between 1:10 and 1:100. It can be seen that the rate control sub-screens 3, 4, 5 have a decrementing transmission rate for the host material, such that use of only one host material evaporation chamber and evaporation source to realize the deposition of electron transport layers with different guest doping concentrations can be guaranteed. It needs to be noted that if the electron transport layer comprises a guest material only, the corresponding rate control sub-screen is arranged to be a non-transmitting invar baffle, i.e. the rate control sub-screen has no openings.

In an embodiment, a spacing zone 7 is arranged between the rate control sub-screens, so as to prevent the rate control screen 1 from deforming. The spacing zone 7 is made of invar with low thermal coefficient of expansion, and is in the shape of a bar or a strip with no openings.

Further, the evaporation equipment also comprises a screen forwarding control wheel 8 for rotation to move the rate control screen 1. As seen in FIG. 4, the rate control screen 1 also comprises a transportation belt 2 for winding on the screen forwarding control wheel 8 to form a forwarding system.

It can be seen that the evaporation equipment in this embodiment can enable a fast switching among different evaporation rates within a same evaporation chamber, thereby improving the evaporation efficiency and reducing the cost in materials and time.

A third embodiment of the present disclosure provides also a manufacturing method of an organic light-emitting diode device. Therein, the organic light-emitting diode device comprises at least two electron transport layers, which are formed by an evaporation process using the evaporation equipment of the second embodiment. The method is specifically as follows.

A host material or a guest material is provided in an evaporation material cavity as the evaporation material, according to a mass ratio between the host material and the guest material for each electron transport layer as required to be formed in said device. A rate control screen is moved such that corresponding rate control sub-screens are aligned in order with the evaporation material nozzles. The evaporation material is evaporated to form each electron transport layer in order. Of course, as well known by a skilled person in the art, a similar or different process is needed at the same time for evaporating or arranging the other one of the host material and the guest material.

In this embodiment, when switching to a different type of rate control sub-screen, a length of 10 to 20 minutes in time for the evaporation rate to reach stability is needed.

For example, if the organic light-emitting diode device to be manufactured comprises three electron transport layers, i.e. a first electron transport layer, a second electron transport layer and a third electron transport layer, the evaporation of the electron transport layers using the evaporation equipment of the second embodiment is carried out, including: providing a host material (or a guest material) in the evaporation material cavity, and moving the rate control screen during evaporation of the first electron transport layer, such that the rate control sub-screens corresponding to the first electron transport layer are aligned with a respective nozzle; during evaporation of the second electron transport layer, moving the rate control screen again, such that the rate control sub-screens corresponding to the second electron transport layer are aligned with a respective nozzle; and during evaporation of the third electron transport layer, moving the rate control screen again, such that the rate control sub-screens corresponding to the third electron transport layer are aligned with a respective nozzle.

It should be noted that the terms "upper", "lower" or the like for indicating a location or a positional relationship is one that is shown on the basis of the drawings, which is provided for facilitating and simplifying the description of this disclosure only, instead of indicating or implying a necessarily specified location of the relevant means or elements, or the construction and operation of the relevant means or elements in a specified location, and accordingly, they should not be understood as limitations to the present disclosure. Unless clearly prescribed and defined otherwise, the terms "mount", "interconnect", "connect", etc. should be understood in a broad sense, for example, the connection can be fixed, detachable, or integral; it can also be a mechanical connection or electrical connection; and it can be direct connection or indirect connection via an intermediate medium, or else internal connection and communication between two elements. For an ordinarily skilled in the art, the meanings of the above terms in the present disclosure can be understood according to specific circumstances.

It also should be noted that the relation terms such as first, second, etc. herein are used only for distinguishing an entity or an operation from another entity or operation, rather than for requiring or implying that these entities or operations should have such relationship or order in practice. Further, the terms "comprise", "include" or any other variants are intended to mean a non-exclusive inclusion such that a process, a method, an article or an apparatus which comprises/includes a series of elements not only includes these elements but also includes other elements that are not explicitly listed, or also includes the inherent elements for this process, method, article or apparatus. In the case of no further limitations, defining elements with the statement "comprising . . . " does not exclude the fact that the process, method, article or apparatus including said elements also includes other elements. The indefinite article "a" or "an" does not exclude a plurality.

The above embodiments are used only for illustrating, not limiting, the technical solution of the present disclosure. Although the present disclosure is illustrated in detail with reference to the above embodiments, an ordinarily skilled in the art should understand that still modifications can be made to the technical solution described based on the above embodiments, or equivalent substitutions can be involved for a part or an integrity of the technical features therein; whereas these modifications or substitutions will not make the essence of the corresponding technical solution depart from the scope of the technical solution of respective embodiment of the present disclosure.

The invention claimed is:

1. An evaporation equipment for evaporating electron transport layers of an organic light-emitting diode device, the evaporation equipment comprising:
   an evaporation material filling cavity;
   an evaporation material nozzle; and
   a rate control screen arranged between and in communication with the evaporation material filling cavity and the evaporation nozzle for controlling the flow rate of an evaporation material flowing from the evaporation material filling cavity to the evaporation material nozzle to control an evaporation rate of the evaporation material, the rate control screen comprising at least two connected rate control sub- screens of different types having different evaporation rates;
   wherein the rate control screen is moveable relative to the evaporation material nozzle to change the rate control sub- screen in alignment with the evaporation material nozzle; and
   wherein in a direction of relative movement of the rate control screen, the evaporation rates of the at least two rate control sub-screens of different types decrease from each sub-screen to each subsequent sub-screen.

2. The evaporation equipment according to claim 1, wherein the evaporation material is a host material or a guest material of the electron transport layers.

3. The evaporation equipment according to claim 1, further comprising:
   a plurality of evaporation material nozzles; and
   a plurality of rate control sub-screens of different types, the rate control sub-screens of different types being alternately arranged;
   wherein the rate control sub-screens are arranged such that a distance between adjacent rate control sub-screens is equal to a distance between adjacent evaporation material nozzles.

4. The evaporation equipment according to claim 3, wherein the different types of rate control sub-screens have different opening densities.

5. The evaporation equipment according to claim 4, wherein the different types of rate control sub-screens are arranged in an order according to the magnitude of the opening density.

6. The evaporation equipment according to claim 4, wherein the plurality of rate control sub-screens comprise three types of rate control sub-screens with opening densities of 10-100 mesh, 150-200 mesh, and 250-400 mesh.

7. The evaporation equipment according to claim 1, wherein a spacing zone is provided between the rate control sub-screens.

8. The evaporation equipment according to claim 7, wherein the spacing zone is made of invar, has no openings, and has shape comprising one of a bar and a strip.

9. The evaporation equipment according to claim 1, further comprising:
   first and second evaporation material filling cavities; and
   first and second evaporation material nozzles;

wherein the second evaporation material filling cavity and nozzle are not in communication with the first evaporation material filling cavity and nozzle; and wherein the second evaporation material filling cavity and nozzle are for evaporation of a second evaporation material that is different from a first evaporation material.

10. The evaporation equipment according to claim 9, further comprising:

a second rate control screen arranged between and in communication with the second evaporation material filling cavity and the second evaporation nozzle for controlling the flow rate of the second evaporation material flowing from the second evaporation material filling cavity to the second evaporation material nozzle to control a second evaporation rate of the second evaporation material, the second rate control screen comprising at least two connected rate control sub-screens of different types having different evaporation rates;

wherein the second rate control screen is moveable relative to the second evaporation material nozzle to change the rate control sub-screen in alignment with the second evaporation material nozzle.

11. The evaporation equipment according to claim 1, further comprising a screen forwarding control wheel to move the rate control screen.

12. The evaporation equipment according to claim 1, wherein the rate control sub-screens are made of invar.

13. A method for manufacturing an organic light-emitting diode device, wherein the device comprises at least two electron transport layers formed by an evaporation process, the method comprising:

using evaporation equipment comprising:
  an evaporation material filling cavity;
  an evaporation material nozzle; and
  a rate control screen arranged between and in communication with the evaporation material filling cavity and the evaporation nozzle for controlling the flow rate of an evaporation material flowing from the evaporation material filling cavity to the evaporation material nozzle to control an evaporation rate of the evaporation material, the rate control screen comprising at least two connected rate control sub-screens of different types having different evaporation rates;
  wherein the rate control screen is moveable relative to the evaporation material nozzle to change the rate control sub-screen in alignment with the evaporation material nozzle; and wherein in a direction of relative movement of the rate control screen, the evaporation rates of the at least two rate control sub-screens of different types decrease from each sub-screen to each subsequent providing a host material or a guest material in the evaporation material cavity as the evaporation material according to a predetermined mass ratio between the host material and the guest material for each electron transport layer;

moving the rate control screen to align one of the rate control sub-screens with the evaporation material nozzle; and evaporating the evaporation material to form each electron transport layer in order.

* * * * *